| (12) | United States Patent | (10) Patent No.: | US 9,726,985 B2 |
|---|---|---|---|
| | Van De Ven et al. | (45) Date of Patent: | Aug. 8, 2017 |

(54) STAGE SYSTEM AND A LITHOGRAPHIC APPARATUS

(71) Applicants: ASML Netherlands B.V., Veldhoven (NL); Koninklijke Philips Electronics N.V., Eindhoven (NL)

(72) Inventors: Bastiaan Lambertus Wilhelmus Marinus Van De Ven, Rosmalen (NL); Antonius Franciscus Johannes De Groot, Someren (NL); Johannes Petrus Martinus Bernardus Vermeulen, Helmond (NL); Theodorus Petrus Maria Cadee, Asten (NL); Robertus Mathijs Gerardus Rijs, Sevenum (NL); Richard Henricus Adrianus Van Lieshout, Batenburg (NL)

(73) Assignees: ASML Netherland B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 98 days.

(21) Appl. No.: 14/376,210

(22) PCT Filed: Jan. 25, 2013

(86) PCT No.: PCT/EP2013/051472
§ 371 (c)(1),
(2) Date: Aug. 1, 2014

(87) PCT Pub. No.: WO2013/113632
PCT Pub. Date: Aug. 8, 2013

(65) Prior Publication Data
US 2014/0375975 A1 Dec. 25, 2014

Related U.S. Application Data

(60) Provisional application No. 61/594,443, filed on Feb. 3, 2012.

(51) Int. Cl.
 *G03B 27/58* (2006.01)
 *G03F 7/20* (2006.01)
 *H02K 41/02* (2006.01)

(52) U.S. Cl.
CPC .......... *G03F 7/70716* (2013.01); *G03F 7/709* (2013.01); *G03F 7/70758* (2013.01); *H02K 41/02* (2013.01)

(58) Field of Classification Search
CPC .. G03F 7/70716; G03F 7/70758; G03F 7/709; H02K 41/02
See application file for complete search history.

(56) References Cited

U.S. PATENT DOCUMENTS 5,504,407 A 4/1996 Wakui et al.
6,040,675 A * 3/2000 Ono ....................... B23Q 15/22
                                                                 108/146

(Continued)

FOREIGN PATENT DOCUMENTS

JP 10-294272 A 11/1998
JP 2008-270801 A 11/2008

(Continued)

OTHER PUBLICATIONS

International Search Report directed to related International Patent Application No. PCT/EP2013/051472, mailed Nov. 4, 2013; 5 pages.

(Continued)

*Primary Examiner* — Deoram Persaud
(74) *Attorney, Agent, or Firm* — Sterne, Kessler, Goldstein & Fox P.L.L.C.

(57) ABSTRACT

A movable stage system is configured to support an object subjected to a lithography process. A short stroke part (SS) is configured to support the object (W) and a long stroke part (LS) is configured to support the short stroke part. The short (Continued)

stroke part is movable over a relative small range of movement with respect to the long stroke part. The long stroke part is movable over a relative large range of movement with respect to a base support arranged to support the long stroke part. A shielding element (SE) is arranged between the short and long stroke parts. A position control system (PCS) maintains a substantially constant distance between the shielding element and the short stroke part.

15 Claims, 4 Drawing Sheets

(56) References Cited

U.S. PATENT DOCUMENTS

| | | | |
|---|---|---|---|
| 6,259,174 B1* | 7/2001 | Ono | G03F 7/70758 |
| | | | 310/13 |
| 7,969,550 B2 | 6/2011 | Geerke et al. | |
| 2004/0114117 A1 | 6/2004 | Bleeker | |
| 2005/0146698 A1 | 7/2005 | Hol et al. | |
| 2006/0061218 A1* | 3/2006 | Hazelton | G03F 7/70725 |
| | | | 310/12.06 |
| 2006/0061219 A1* | 3/2006 | Hazelton | G03F 7/70758 |
| | | | 310/12.06 |
| 2007/0091291 A1 | 4/2007 | Phillips | |
| 2007/0146656 A1 | 6/2007 | Van Empel | |
| 2007/0206169 A1* | 9/2007 | Butler | G03F 7/70766 |
| | | | 355/53 |
| 2007/0236854 A1* | 10/2007 | Lee | G03F 7/70716 |
| | | | 361/143 |
| 2008/0158539 A1* | 7/2008 | Shibata | G03B 27/32 |
| | | | 355/72 |
| 2008/0266037 A1 | 10/2008 | Williams | |
| 2009/0316129 A1 | 12/2009 | Butler et al. | |
| 2010/0128241 A1* | 5/2010 | Kruizinga | G03F 7/70341 |
| | | | 355/72 |
| 2012/0057140 A1* | 3/2012 | Aoki | G03F 7/70716 |
| | | | 355/53 |
| 2012/0242271 A1 | 9/2012 | Van Der Toorn et al. | |
| 2013/0293865 A1* | 11/2013 | Ummethala | H01J 37/20 |
| | | | 355/75 |
| 2013/0335722 A1* | 12/2013 | Aangenent | G03F 7/70866 |
| | | | 355/72 |
| 2015/0029484 A1* | 1/2015 | Kii | G03F 7/70716 |
| | | | 355/72 |

FOREIGN PATENT DOCUMENTS

| | | |
|---|---|---|
| JP | 2010-067950 A | 3/2010 |
| JP | 2010-238984 A | 10/2010 |
| JP | 2011-060823 A | 3/2011 |
| JP | 2011-091298 A | 5/2011 |

OTHER PUBLICATIONS

International Preliminary Report on Patentability and Written Opinion of the International Searching Authority directed to related International Patent Application No. PCT/EP2013/051472, issued Aug. 5, 2014; 6 pages.

* cited by examiner

STAGE SYSTEM AND A LITHOGRAPHIC APPARATUS

CROSS-REFERENCE TO RELATED APPLICATIONS

This application claims the benefit of U.S. provisional application 61/594,443 which was filed on Feb. 3, 2012, and which is incorporated herein in its entirely by reference.

BACKGROUND

Field of the Invention

The present invention relates to a stage system and a lithographic apparatus comprising a stage system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus comprises a movable stage system configured to support a substrate. The stage system is movable to position the substrate supported thereon in six degrees of freedom with high accuracy. The main plane of movement of the stage system is parallel to the main plane of the substrate, for example the horizontal plane, although the stage system is usually also capable of moving the substrate over a small range in the direction perpendicular to the main plane of the substrate, e.g. the vertical direction.

In an embodiment, the stage system is a dual part substrate stage comprising a short stroke part configured to support the substrate and a long stroke part configured to support the short stroke part, wherein said short stroke part is movable over a first range of movement with respect to the long stroke part, and wherein said long stroke part is movable over a second range of movement with respect to a base support arranged to support the long stroke part, wherein said second range of movement is substantially larger than the first range of movement.

The short stroke part is arranged above the long stroke part at a relatively small distance. Movement and/or deformation of the long stroke part may result in disturbances on the short stroke part. These disturbances caused by the long stroke part may be of different types such as electromagnetic forces, air pressure disturbances due to movements or deformations of the long stroke part, and thermal loads. Also dynamic links, such as flexes, hoses, fibers or cables running between the long stroke part and the short stroke part may transfer disturbances from the long stroke part to the short stroke part.

In particular, shape changes or movement of the long stroke part, for instance bending due to actuation of the coils in the long stroke part may result in pressure variations in the space between the short stroke part and the long stroke part. These pressure variations in the space between the short stroke part and the long stroke part, may have a substantial negative effect on the overlay and focus performance of the short stroke part. The movement and/or deformation of the long stroke part may also have a disturbing effect on other parts of the lithographic apparatus, such as encoder system grid plates arranged above the stage system.

SUMMARY

Generally, it is desirable to provide an improved substrate stage system. Further, it is desirable to provide a stage system having a short stroke part long stroke part, with improved positioning of the short stroke part, and which is preferably less sensitive to disturbances caused by the long stroke part. It is also desirable to provide al lithographic apparatus with a first and a second object, wherein the position of the second object is less influenced by disturbance of the first object. In particular, it is desirable to provide a lithographic apparatus comprising a stage system, having a short stroke part long stroke part, with improved positioning of the short stroke part, and which is preferably less sensitive to disturbances caused by the long stroke part.

According to an embodiment of the invention, there is provided a movable stage system configured to support an object, wherein the stage system comprises:

a short stroke part configured to support the object and a long stroke part configured to support the short stroke part, wherein said short stroke part is movable over a first range of movement with respect to the long stroke part, and wherein said long stroke part is movable over a second range of movement with respect to a base support arranged to support the long stroke part, wherein said second range of movement is substantially larger than the first range of movement, a shield element arranged between the short stroke part and the long stroke part, and configured to shield the short stroke part for pressure variations in a space between the long stroke part and the short stroke part, which pressure variations are caused by movements and/or deformations of the long stroke part, and a position control system to control a position related quantity of the shielding element, wherein said position control system is configured to maintain a substantially constant distance between the shielding element and the short stroke part, wherein the position control system comprises a sensor to determine a position related quantity of the shielding element with respect to the short stroke part, a controller to provide a control signal on the basis of the determined position related quantity and at least one actuator to actuate the shielding element on the basis of the control signal, and wherein the actuator is arranged between the shielding element and the long stroke part or between the shielding element and the base support.

According to an embodiment of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate support constructed to hold a substrate; and a projection system configured to project the patterned radiation beam onto a target portion of the substrate, wherein the lithographic apparatus comprises a movable stage system configured to support an object, wherein the stage system comprises:

a short stroke part configured to support the object;

a long stroke part configured to support the short stroke part, wherein said short stroke part is movable over a first range of movement with respect to the long stroke part, and wherein said long stroke part is movable over a second range of movement with respect to a base support arranged to support the long stroke part, wherein said second range of movement is substantially larger than the first range of movement, a shield element arranged between the short stroke part and the long stroke part, and configured to shield the short stroke part for pressure variations in a space between the long stroke part and the short stroke part, which pressure variations are caused by movements and/or deformations of the long stroke part, and a position control system to control a position related quantity of the shielding element, wherein said position control system is configured to maintain a substantially constant distance between the shielding element and the short stroke part, wherein the position control system comprises a sensor to determine a position related quantity of the shielding element with respect to the short stroke part, a controller to provide a control signal on the basis of the determined position related quantity and at least one actuator to actuate the shielding element on the basis of the control signal, wherein the actuator is arranged between the shielding element and the long stroke part or between the shielding element and the base support, and wherein the stage system is the patterning device support or the substrate support.

According to an embodiment of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate support constructed to hold a substrate; and a projection system configured to project the patterned radiation beam onto a target portion of the substrate, a first object, a second object, a shield element arranged between the first object and the second object, and configured to shield the second object for pressure variations in a space between the first object and the second object, which pressure variations are caused by movements and/or deformations of the first object, and a position control system to control a position related quantity of the shielding element, wherein said position control system is configured to maintain a substantially constant distance between the shielding element and the second object, wherein the position control system comprises a sensor to determine a position related quantity of the shielding element with respect to the second object, a controller to provide a control signal on the basis of the determined position related quantity and at least one actuator to actuate the shielding element on the basis of the control signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
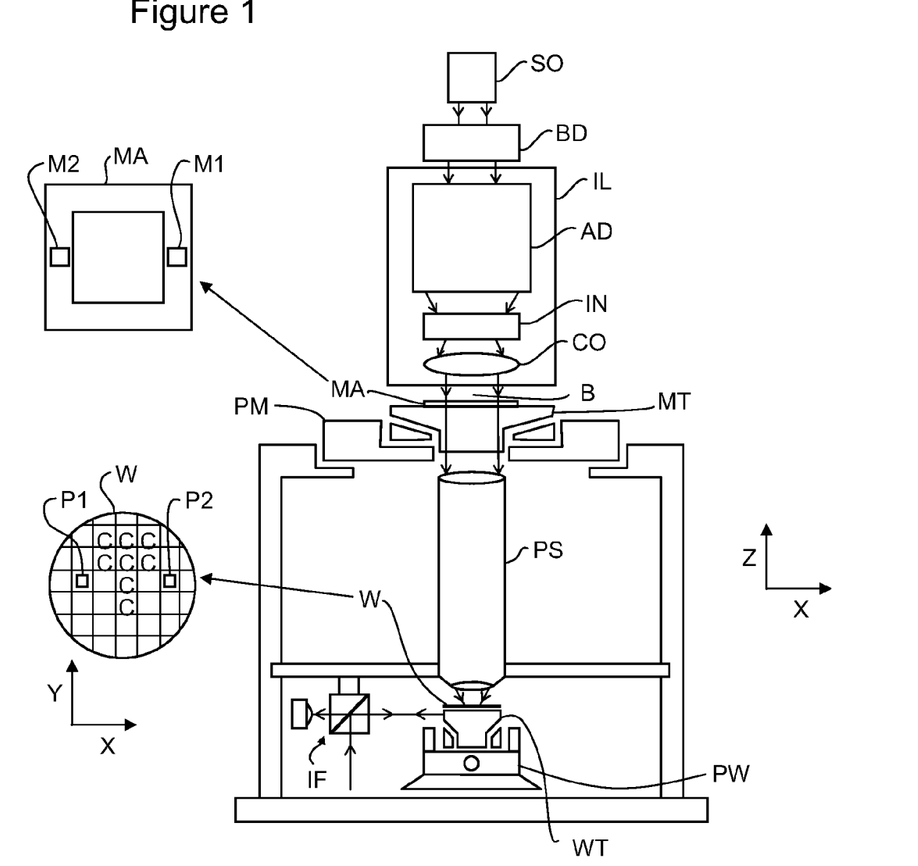
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
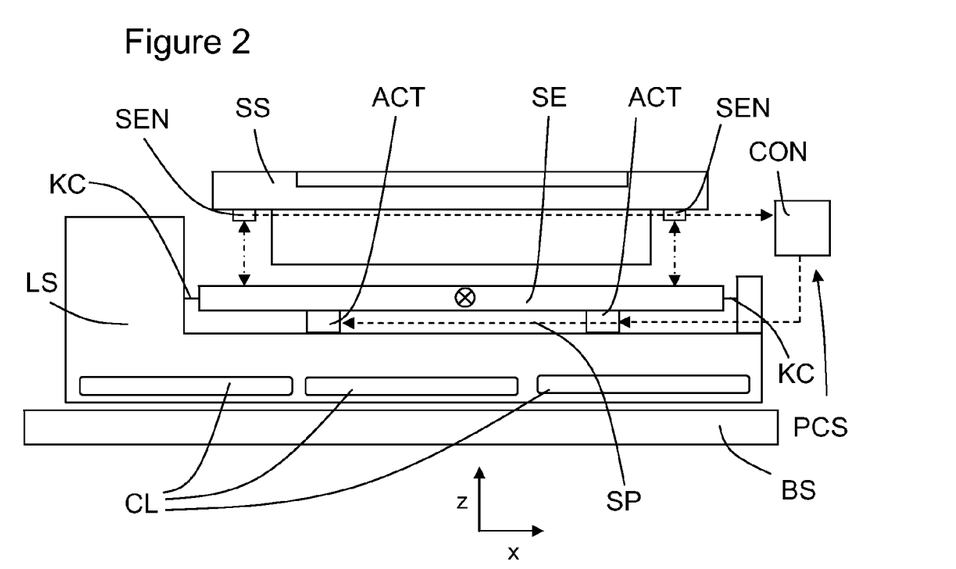
FIG. 2 depicts a side view of a stage system according to a first embodiment of the invention

FIG. 2 depicts a movable substrate stage system of a lithographic apparatus comprising short stroke part SS and a long stroke part LS. The short stroke part SS is configured to support a wafer W. the short stroke part SS may comprise an encoder block. On the encoder block a number of encoder sensors may be mounted to cooperate with one or more grid plates mounted to a reference element, for example a reference frame, such as a metroframe or a reference object such as the projection system PS.

In an alternative embodiment the short stroke part SS may comprise a mirror block having a number of reflective surfaces which serve as mirror surfaces for an interferometer system. The encoder block or mirror block may support a substrate table on which a substrate W can be held for instance by a vacuum clamp.

The short stroke part SS is movably supported on the long stroke part LS with a space SP therebetween. Short stroke actuators (not shown) are provided to move the short stroke part SS with respect to the long stroke part over a relatively small range of movement. Within this small range of movement, the short stroke part can be positioned with high accuracy, normally in three or six degrees of freedom.

The long stroke part LS is supported on a base support BS, for example a base frame, in particular a magnet plate mounted on the base frame. The long stroke part LS is movable over a relative large range of movement with respect to the base support BS, i.e. the range of movement of the long stroke part LS with respect to the base support BS is substantially larger than the range of movement of the short stroke part SS with respect to the long stroke part LS.

The accuracy of the positioning of the long stroke part LS may be relatively low. The main task of the positioning of the long stroke part LS is to position the target position of the short stroke part SS within the range of movement of the short stroke part SS. Within this smaller range of movement, the short stroke part SS can be positioned with high accuracy in the target location.

The long stroke part LS comprises a number of coils CL forming part of the short stoke and/or long stroke actuators. Actuation of these coils CL may result in movement and/or deformation of the long stroke part LS. This movement and/or deformation may result in pressure variations in the space SP between the long stroke part LS and the short stroke part SS.

A shield element SE is arranged between the short stroke part SS and the long stroke part LS to shield the short stroke part SS from the effects of these pressure variations. In the absence of such shield element SE, the pressure variations may have a substantially larger negative effect on the position accuracy of the short stroke part SS and therewith have a substantial negative effect on the overlay and focus performance of the short stroke part SS. In practice, the disturbances caused by the long stroke part LS may be the main limiting factor for the overlay and focus performance of the short stroke part SS.

To shield the short stroke part SS from the pressure variations in the space SP, a position control system PCS is provided which is configured to maintain a substantially constant distance between the short stroke part SS and the shield element SE. The position control system PCS of the embodiment of FIG. 2 is configured to maintain a constant distance in the z-direction, as this is the main direction for transfer of disturbances due to pressure variations in the space SP.

The position control system PCS comprises sensors SEN, a controller CON and actuators ACT.

The sensors SEN are mounted on the short stroke part SS and arranged to measure a distance between the short stroke part SS and the shield element SE. Each of the sensors SEN is configured to measure the distance between the shield element SE and the short stroke part SS in the z-direction. The sensors SEN may be of any suitable type, such as optical sensors or capacitive sensors. In an alternative embodiment, the sensors may be mounted on the shield element SE.

Also the sensor or sensors SEN may be mounted on an other object, whereby the distance between the short stroke part SS and the shield element SE is determined on the basis of a difference between a distance from the other object to the short stroke part SS and a distance from the other object to the shield element SE. An assembly of sensors to determine such difference in distance is regarded to be a sensor to measure the distance between the short stroke part SS and the shield element SE. For example, the metro-frame or base support can be used as an alternative mounting location of the sensors.

Kinematic couplings KC are provided to maintain the shield element SE in substantially the same x-y position, but to make movements of the shield element SE in the z-direction possible. The kinematic couplings KC may for instance be leaf springs holding the shield element SE in substantially the same x-y position, but which allow movement of the shield element SE in the z-direction.

The measured distance between the shield element SE and the short stroke part SS is provided as a sensor signal to the controller CON. The controller CON may be a separate controller or a part of any other control system, for example the stage position control system. The controller may also be part of a central processing unit of the lithographic apparatus.

The controller CON is configured to maintain substantially the same distance between the shield element SE and the short stroke part SS. The aim of the controller may be to maintain the distance, in z-direction, between shield element SE and short stroke part SS at a desired set-point. As an alternative, the controller may be aimed at maintaining the speed and/or acceleration of the shield element SE with respect to the short stroke part SS at zero.

The controller CON provides a control signal to the actuators ACT. The actuators ACT are provided to actuate the shield element SE in the z-direction. The actuators ACT are provided between the long stroke part LS and the shield element SE. The actuators SE may be any type of actuators, such as piezo actuators, electromagnetic actuators, Lorentz actuators. The range of movement of the actuators ACT should preferably be as large as the range of movement required between the long stroke part LS and the short stroke part SS.

The controller shown in FIG. 2 controls the distance between the shield element SE and the short stroke part SS on the basis of a feedback loop from sensors SEN measuring the distance between the short stroke part SS and the shield element SE. As an alternative, or in addition thereto, a feed-forward loop may be used. Such feed-forward loop may use information on the movement and/or deformations measured in the long stroke part LS to control the position of the shield element SE. Such feed-forward actuation of the shield element SE may also substantially correct for the pressure variation effects in the space SP as a result of the movements and/or deformation of the long stroke part LS. In such embodiment one or more sensors may be provided, for example between the base support BS and the long stroke part LS and/or in the long stroke part LS to measure the movement and/or deformations of the long stroke part LS.

By maintaining a constant distance between the shield element SE and the short stroke part SS, the pressure variations in the space SP will have substantially less effect on the accuracy of the positioning of the short stroke part SS. As a result, the focus and overlay performance of the short stroke part SS may be increased.

The shield element SE shown in FIG. 2 is a plate shaped object. In alternative embodiments, the shield element SE may have any shape that can be arranged between the long stroke part LS and the short stroke part SS and which is capable of shielding the short stroke part SS from pressure variations in the space SP caused by movements and/or deformation of the long stroke part LS. The shield element SE may also comprise multiple shield plates and/or other objects having a shielding effect.

The shield element SE is preferably made of light and stiff material. The shield element may for instance be at least partly constructed from ceramic material. The shield element SE may further comprise material with high heat conductivity, and/or material which absorbs or reflect electromagnetic fields and/or electric field absorbing or reflecting materials. The shield element SE may be provided with a cooling system, for instance one or more cooling channels running through or on the shield element SE. By providing material with high heat conductivity or a cooling system, the heat transfer of the long stroke part LS to the short stroke part SS can be decreased, which may have a positive effect on the position accuracy of the short stroke part SS. Further, the provision of material which absorbs or reflects electromagnetic or electric fields on the shield element SE decreases the effect of electromagnetic fields and/or electric fields originating from the long stroke part LS on the positioning accuracy of the short stroke part SS.

Figure 3:
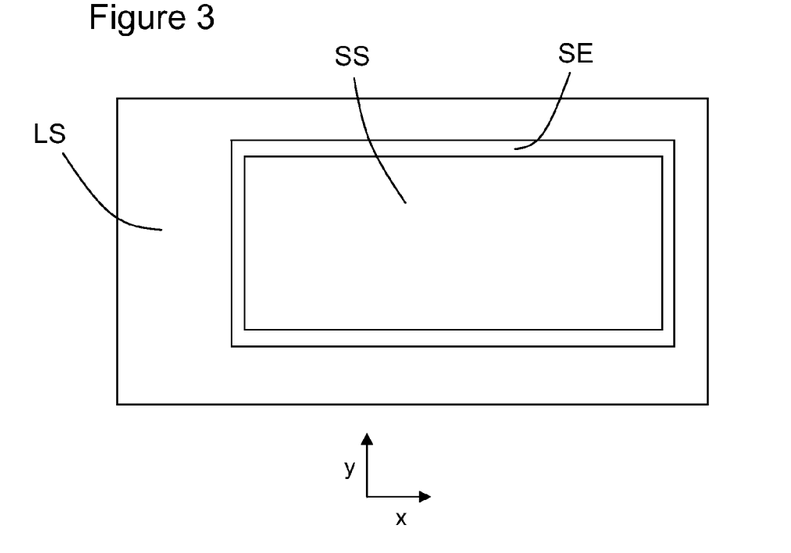
FIG. 3 depicts a schematic top view of the embodiment of FIG. 1.

FIG. 3 shows schematically a top view on the long stroke part LS, the short stroke part SS and the shield element SE. From the top view it can be seen that, in the projection in the z-direction, i.e. the direction in which the distance between the shield element SE and the short stroke part SS is controlled, the surface area of the shield element SE extends over the complete surface area of the short stroke part SS. Therefore, substantially all pressure variations in the space SP in the controlled z-direction are shielded by the shielding element SE.

Generally, it is desirable that in a projection in the controlled direction, i.e. the direction in which the distance between the short stroke part SS and the shield element SE is controlled, the surface area of the shield element SE extends over a substantial part of the surface area of the short stroke part SS, for example at least 50% of the surface area of the long stroke part LS, preferably at least 75% of the surface area of the long stroke part LS, more preferably at 100% of the surface area of the long stroke part LS.

Furthermore, the location of the shielding element may be arranged at a location where the pressure variations are known to have a large effect on the accuracy of positioning of the short stroke part SS.

The size and location of the shield element SE may also be selected to shield other parts of the lithographic apparatus from pressure variations resulting from movement and/or deformation of the long stroke part. For example, the shield element SE shown in FIG. 2 may also substantially decrease the effect of pressure variations on grid plates or other parts of a position measurement system mounted above the short stroke part.

Figure 4:
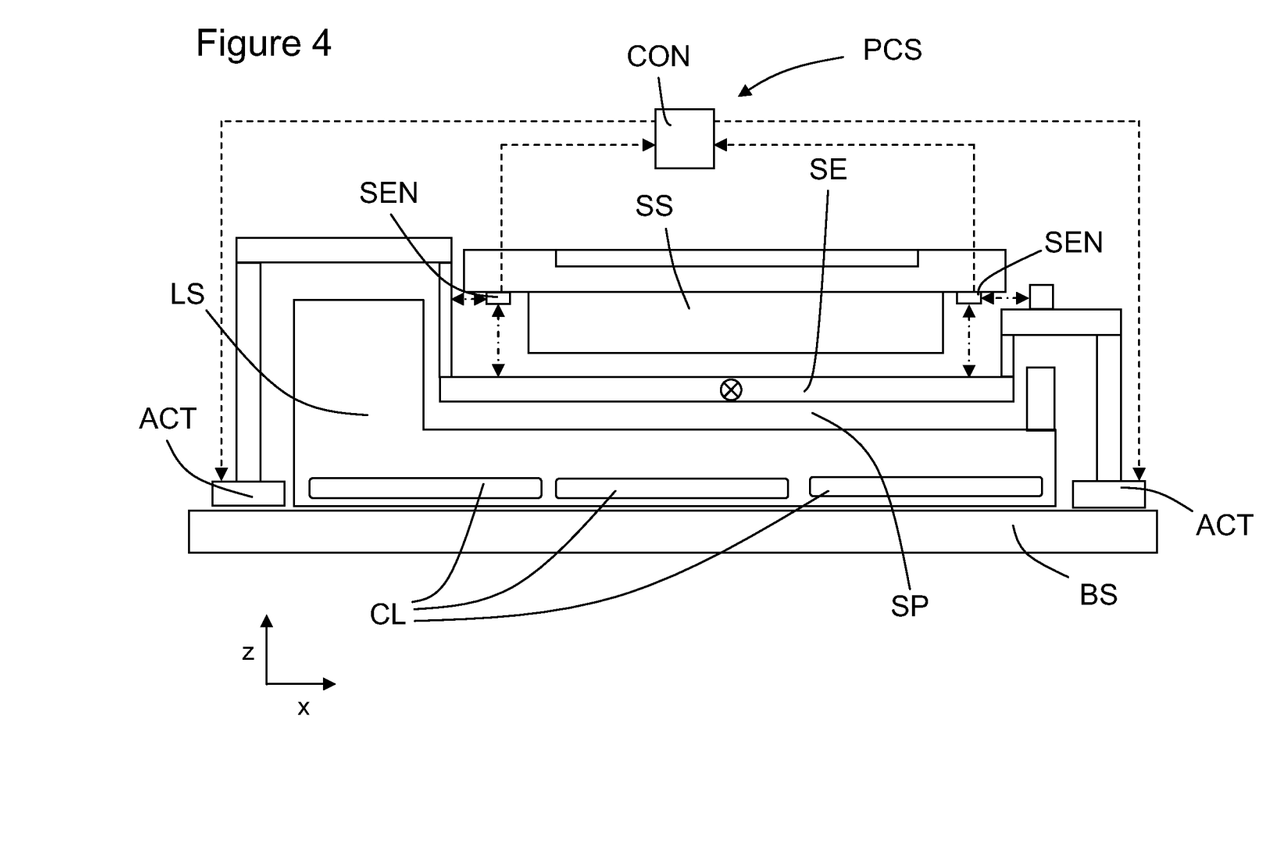
FIG. 4 depicts a side view of a stage system according to a second embodiment of the invention.

FIG. 4 shows a second embodiment of a stage system according to the invention. The stage system comprises, corresponding to the embodiment of FIG. 2, a short stroke part SS and a long stroke part LS, wherein the asp is movable with respect to the long stroke part LS and the long stroke part LS is movable with respect to a base support BS.

Parts of the stage system having the same or substantially the same function as the stage system in FIG. 2 are indicated by the same reference signs.

Between the long stroke part LS and the short stroke part SS a shield element SE is arranged which shields the short stroke part SS from pressure variations in the space SP caused by movements and/or deformation of the long stroke part LS. The shield element encloses the long stroke part LS at least at the side faced towards the short stroke part SS so that the influence of the disturbances caused by the long stroke part LS on the positioning may be further reduced. The base support BS and the shield element SE fully enclose the long stroke part LS. Also, the short stroke part SS is substantially enclosed by the shield element SE, at least at the side directed towards the long stroke part LS.

The shield element SE is actuated and supported by actuators ACT which directly cooperate with the base support BS. The shield element SE is movable in six degrees of freedom. The base support BS, for example a magnet plate, may be a stable stationary object and may be more suitable for actuation and support of the shield element SE than the long stroke part LS itself.

The sensors SEN are configured to determine the position of the shield system SE in six degrees of freedom. The actuators ACT are configured to position the shield system SE in six degrees of freedom. The controller CON is configured to maintain a substantially constant distance between the shielding element SE and the short stroke part SS in three directions, i.e. the x-direction, the y-direction and the z-direction.

An advantage of the shield element SE enclosing the long stroke part LS is that other objects sensitive for pressure variations caused by movement and/or deformation of the long stroke part LS may be properly shielded against these disturbances. For example, grid plates mounted on the metroframe or projection system above the stage system may be sensitive for disturbances caused by the movements and/or deformations of the long stroke part LS. Enclosure of the long stroke part LS decreases these effects.

In addition or as an alternative, a shield element may be provided between the long stroke part LS and each of the grid plates. The position of the shield element may be controlled to maintain substantially the same distance between the grid plate and the shield element. The shield element may be transparent to transmit a sensor beam of the encoder sensor mounted on the short stroke part SS.

Figure 5:
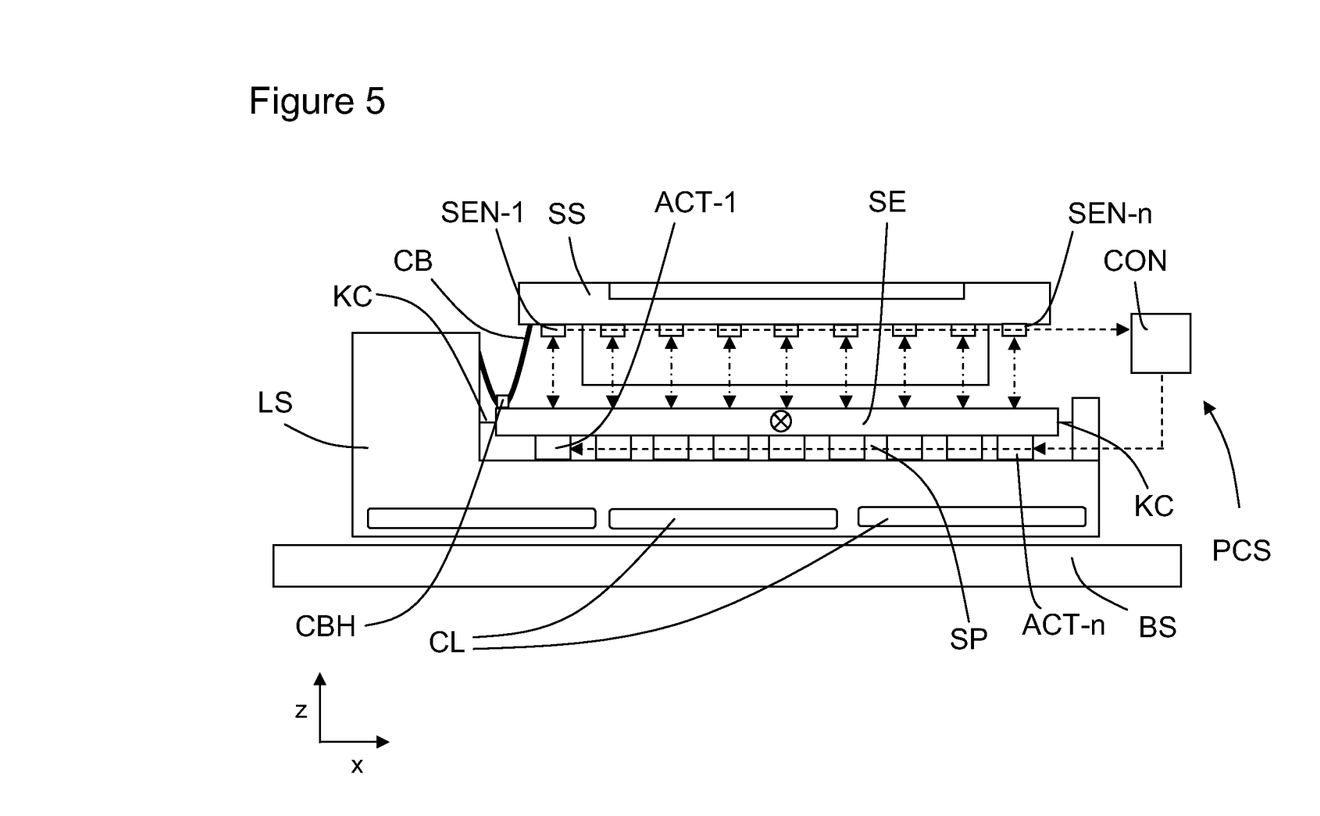
FIG. 5 depicts a side view of a stage system according to a third embodiment of the invention.

FIG. 5 shows a third embodiment of a stage system according to the invention. The stage system comprises, corresponding to the embodiments of FIGS. 2 and 4, a short stroke part SS and a long stroke part LS, wherein the asp is movable with respect to the long stroke part LS and the long stroke part LS is movable with respect to a base support BS.

Parts of the stage system having the same or substantially the same function as the stage system in FIG. 2 are indicated by the same reference signs.

In the embodiment of FIG. 5, a plate shaped shield element SE is provided between the long stroke part LS and the short stroke part SS, similar to the shield element of FIG. 2. This plate shaped shield element SE may have some flexibility, for instance as a result of a desired low mass.

The position control system PCS is configured to control a shape of the shield element SE. The shape of the shield element SE may be determined by multiple sensors, for example a one or multidimensional array of sensors SEN-1 to SEN-n, which each measure a distance between the short stroke part SS and the shield element SE. Multiple actuators ACT-1 to ACT-n may be provided to actuate the shield element SE at different locations on the shield element SE.

The position control system PCS of FIG. 5 is provided to control the shape of the shield element SE in a single direction, i.e. the sensors SEN-1 to SEN-n are configured to measure the distance between the short stroke part SS and the shield element SE in a single direction, the z-direction, and the actuators ACT-1 to ACT-n are configured to actuate the shield element SE in a single direction, the z-direction. In another embodiment, the sensors SEN-1 to SEN-n and actuators ACT-1 to ACT-n may be configured to act in multiple directions and/or multiple degrees of freedom, for instance in three or six degrees of freedom.

In the embodiment of FIG. 5, each of the sensors SEN-1 to SEN-n is aligned with one of the actuators ACT-1 to ACT-n. This is in principle not required. The sensors SEN-1 to SEN-n and actuators ACT-1 to ACT-n may be arranged at any suitable location. Also, the number of sensors SEN-1 to SEN-n and actuators ACT-1 to ACT-n does not have to be the same.

The aim of the controller is to hold the shield element SE at substantially the same distance from the short stroke part SS by holding the shield element SE in a set-point position with respect to the short stroke part SS or by maintaining the speed difference or acceleration difference between the short stroke part SS and the shield element SE at zero. This aim may be achieved by a feedback loop as shown in FIG. 5, and/or a feed-forward loop as described with respect to the embodiment of FIG. 2.

The shield element SE shown in FIG. 5 further supports a cable bundle holder CBH which holds a cable bundle CB running between the long stroke part LS and the short stroke part SS. Since the distance between the short stroke part SS and the shield element SE is maintained substantially constant, at least in the z-direction, less disturbances are transferred from the long stroke part LS to the short stroke part SS via the cable bundle CB.

The cable bundle CB may comprise any type of mechanical connections between the long stroke part LS and the short stroke part SS, such as electrical cables, optical fibers, hoses, control cables.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A movable stage system configured to support an object, wherein the stage system comprises:
   a short stroke part configured to support the object;
   a long stroke part configured to support the short stroke part, wherein said short stroke part is movable over a first range of movement with respect to the long stroke part, and wherein said long stroke part is movable over a second range of movement with respect to a base support arranged to support the long stroke part, wherein said second range of movement is substantially larger than the first range of movement,
   a shield element arranged between the short stroke part and the long stroke part, and configured to shield the short stroke part for pressure variations in a space between the long stroke part and the short stroke part, wherein the pressure variations are caused by movements and/or deformations of the long stroke part, and a position control system to control a position related quantity of the shielding element, wherein said position control system is configured to maintain a substantially constant distance between the shielding element and the short stroke part, wherein the position control system comprises a sensor to determine a position related quantity of the shielding element with respect to the short stroke part, a controller to provide a control signal on the basis of the determined position related quantity and at least one actuator to actuate the shielding element on the basis of the control signal, and wherein the actuator is arranged between the shielding element and the long stroke part or between the shielding element and the base support.

2. The stage system of claim 1, wherein a position related quantity of the shield element is controlled in a first direction, and the shield element substantially extends over, in a projection in the first direction, overlapping surfaces of the short stroke part and the long stroke part.

3. The stage system of claim 1, wherein the sensor is arranged on the short stroke part.

4. The stage system of claim 1, wherein the position related quantity is a position, speed, or acceleration of the shielding element with respect to the short stroke part.

5. The stage system of claim 1, wherein the shielding element is mounted on the long stroke part with one or more kinematic couplings to stabilize the shielding element in main directions of movement of the stage system, and wherein the position control system is configured to maintain a constant distance between the short stroke part and the long stroke part in a direction substantially perpendicular to the main directions of movement.

6. The stage system of claim 1, wherein the position control system comprises one or more sensors to determine a position related quantity of the shielding element with respect to the short stroke part in three perpendicular directions and at least three actuators to actuate the shielding element on the basis of the sensor signal in the three directions to maintain a substantially constant position of the shielding element with respect to the short stroke part.

7. The stage system of claim 1, wherein the shielding element is a plate-shaped element.

8. The stage system of claim 1, wherein the shielding element substantially encloses the long stroke part at at least a side of the long stroke part faced towards the short stroke part.

9. The stage system of claim 1, wherein the shielding element substantially encloses the short stroke part at at least a side of the short stroke part faced towards the short stroke part.

10. The stage system of claim 1, wherein the position control system is configured to control a shape of the shielding element.

11. The stage system of claim 10, wherein the position control system comprises multiple sensors to determine a shape of the shielding element, and multiple actuators mounted at multiple locations of the shielding element to control the shape of the shielding element.

12. The stage system of claim 1, wherein the shielding element comprises an active or passive cooling system and/or heat absorbing or reflecting materials, and/or electromagnetic absorbing or reflecting materials and/or electric field absorbing or reflecting materials.

13. The stage system of claim 1, wherein the shielding element supports a cable bundle holder to hold a cable bundle running between the long stroke part and the short stroke part.

14. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate support constructed to hold a substrate; and
a projection system configured to project the patterned radiation beam onto a target portion of the substrate,
wherein the lithographic apparatus comprises the movable stage system of claim 1, and wherein the stage system is the patterning device support or the substrate support.

15. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate support constructed to hold a substrate;
a projection system configured to project the patterned radiation beam onto a target portion of the substrate,
a first object,
a second object,
a shield element arranged between the first object and the second object, and configured to shield the second object for pressure variations in a space between the first object and the second object, wherein the pressure variations are caused by movements and/or deformations of the first object, and
a position control system to control a position related quantity of the shielding element, wherein said position control system is configured to maintain a substantially constant distance between the shielding element and the second object, wherein the position control system comprises a sensor to determine a position related quantity of the shielding element with respect to the second object, a controller to provide a control signal on the basis of the determined position related quantity and at least one actuator to actuate the shielding element on the basis of the control signal.

* * * * *

UNITED STATES PATENT AND TRADEMARK OFFICE
CERTIFICATE OF CORRECTION

PATENT NO. : 9,726,985 B2  
APPLICATION NO. : 14/376210  
DATED : August 8, 2017  
INVENTOR(S) : Van De Ven et al.

Page 1 of 1

It is certified that error appears in the above-identified patent and that said Letters Patent is hereby corrected as shown below:

On the Title Page (73) Assignee section, after "ASML" please delete "Netherland" and insert --Netherlands--.

Signed and Sealed this
Fifth Day of December, 2017

Joseph Matal
*Performing the Functions and Duties of the
Under Secretary of Commerce for Intellectual Property and
Director of the United States Patent and Trademark Office*